US010332906B2

(12) United States Patent
Narumiya et al.

(10) Patent No.: US 10,332,906 B2
(45) Date of Patent: Jun. 25, 2019

(54) DRY ETCHING METHOD AND METHOD FOR MANUFACTURING SEMICONDUCTOR DEVICE

(71) Applicant: TOSHIBA MEMORY CORPORATION, Tokyo (JP)

(72) Inventors: Kaori Narumiya, Yokkaichi Mie (JP); Hisataka Hayashi, Yokkaichi Mie (JP); Keisuke Kikutani, Yokkaichi Mie (JP); Akio Ui, Tokyo (JP); Yosuke Sato, Kanagawa (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 15/661,243

(22) Filed: Jul. 27, 2017

(65) Prior Publication Data

US 2018/0145086 A1 May 24, 2018

(30) Foreign Application Priority Data

Nov. 21, 2016 (JP) ................................ 2016-226298

(51) Int. Cl.

| | |
|---|---|
| ***H01L 27/11582*** | (2017.01) |
| ***H01L 21/311*** | (2006.01) |
| ***H01L 21/3213*** | (2006.01) |
| ***H01J 37/32*** | (2006.01) |
| ***H01L 27/1157*** | (2017.01) |
| ***H01L 27/11575*** | (2017.01) |

(52) U.S. Cl.

CPC .. *H01L 27/11582* (2013.01); *H01J 37/32706* (2013.01); *H01L 21/31116* (2013.01); *H01L 21/32136* (2013.01); *H01L 21/32137* (2013.01); *H01L 27/1157* (2013.01); *H01L 27/11575* (2013.01); *H01J 2237/334* (2013.01)

(58) Field of Classification Search

CPC ......... H01L 27/11582; H01L 21/32136; H01L 21/31116; H01L 21/32134; C23F 1/10; C23F 1/38

See application file for complete search history.

(56) References Cited

U.S. PATENT DOCUMENTS 5,352,324 A 10/1994 Gotoh et al.
6,492,277 B1 12/2002 Ono et al.
(Continued)

FOREIGN PATENT DOCUMENTS

JP H11-219938 A 8/1999
JP 2002-529913 A 9/2002
(Continued)

*Primary Examiner* — Nadine G Norton
*Assistant Examiner* — Mahmoud Dahimene
(74) *Attorney, Agent, or Firm* — Foley & Lardner LLP

(57) ABSTRACT

A dry etching method includes a process of, while continuously applying bias power using an ion species to a material to be processed including a first conductive member, a first insulating film provided on the first conductive member, a second conductive member provided on the first insulating film, and a second insulating film provided on the second conductive member, dry etching the second insulating film to expose the second conductive member. A time for which the bias power is continuously applied is set to 50 microseconds or less and a duty ratio of the bias power is set to 50% or less.

13 Claims, 13 Drawing Sheets

FIRST STEP
SECOND STEP
ALTERNATING-CURRENT POWER PH
ALTERNATING-CURRENT POWER PL
PULSE SIGNAL SP
ON
OFF
Toff
Ton
Toff
Ton
TIME

(56) References Cited

U.S. PATENT DOCUMENTS

| | | | | |
|---|---|---|---|---|
| 6,759,339 | B1 * | 7/2004 | Choi | B82Y 10/00 257/E21.311 |
| 7,718,538 | B2 | 5/2010 | Kim et al. | |
| 8,703,002 | B2 | 4/2014 | Matsudo et al. | |
| 2009/0068829 | A1 * | 3/2009 | Lee | H01L 21/28061 438/594 |
| 2009/0085132 | A1 * | 4/2009 | Kao | B82Y 10/00 257/421 |

FOREIGN PATENT DOCUMENTS

| | | | |
|---|---|---|---|
| JP | 2014-187231 | A | 10/2014 |
| WO | WO-00/26956 | A1 | 5/2000 |

* cited by examiner

DRY ETCHING METHOD AND METHOD FOR MANUFACTURING SEMICONDUCTOR DEVICE

CROSS-REFERENCE TO RELATED APPLICATION

This application claims the benefit of and priority to Japanese Patent Application No. 2016-226298, filed Nov. 21, 2016, the entire contents of which are incorporated herein by reference.

FIELD

Embodiments described herein relate generally to a dry etching method and a method for manufacturing a semiconductor device.

BACKGROUND

Heretofore, in semiconductor memory devices, microstructuring of circuits has been used to attain capacity enlargement. As the microstructure technology is approaching the limit, a stacked-structure semiconductor memory device is being proposed to attain further capacity enlargement. However, improvements in such stacked-structure semiconductor memory devices and manufacturing method thereof remain desired.

DETAILED DESCRIPTION

In some embodiments, a stacked-structure semiconductor memory device is manufactured by, after forming a stacked body by alternately stacking two types of films in layers on a semiconductor substrate, forming holes in the stacked body using dry etching and then forming a semiconductor member serving as a channel in each hole. In order to manufacture a large-capacity stacked-structure semiconductor memory device, in some embodiments, a technique to stably form holes with high aspect ratios may be used.

An example embodiment provides a dry etching method and a method for manufacturing a semiconductor device which are capable of stably forming apertures with high aspect ratios.

In general, according to some embodiments, a dry etching method includes a first process of, while continuously applying bias power using an ion species to a material to be processed including a first conductive member, a first insulating film provided on the first conductive member, a second conductive member provided on the first insulating film, and a second insulating film provided on the second conductive member, dry etching the second insulating film to expose the second conductive member. In some embodiments, a time for which the bias power is continuously applied may be set to 50 microseconds or less and a duty ratio of the bias power may be set to 50% or less.

In general, according to some embodiments, a method for manufacturing a semiconductor device includes a first process of, while continuously applying bias power using an ion species to a material to be processed including a first conductive member, a first insulating film provided on the first conductive member, a second conductive member provided on the first insulating film, and a second insulating film provided on the second conductive member, etching the second insulating film to expose the second conductive member. In some embodiments, a time for which the bias power is continuously applied may be set to 50 microseconds or less and a duty ratio of the bias power may be set to 50% or less.

First, a dry etching apparatus for use in some embodiments will be described.

Figure 1:
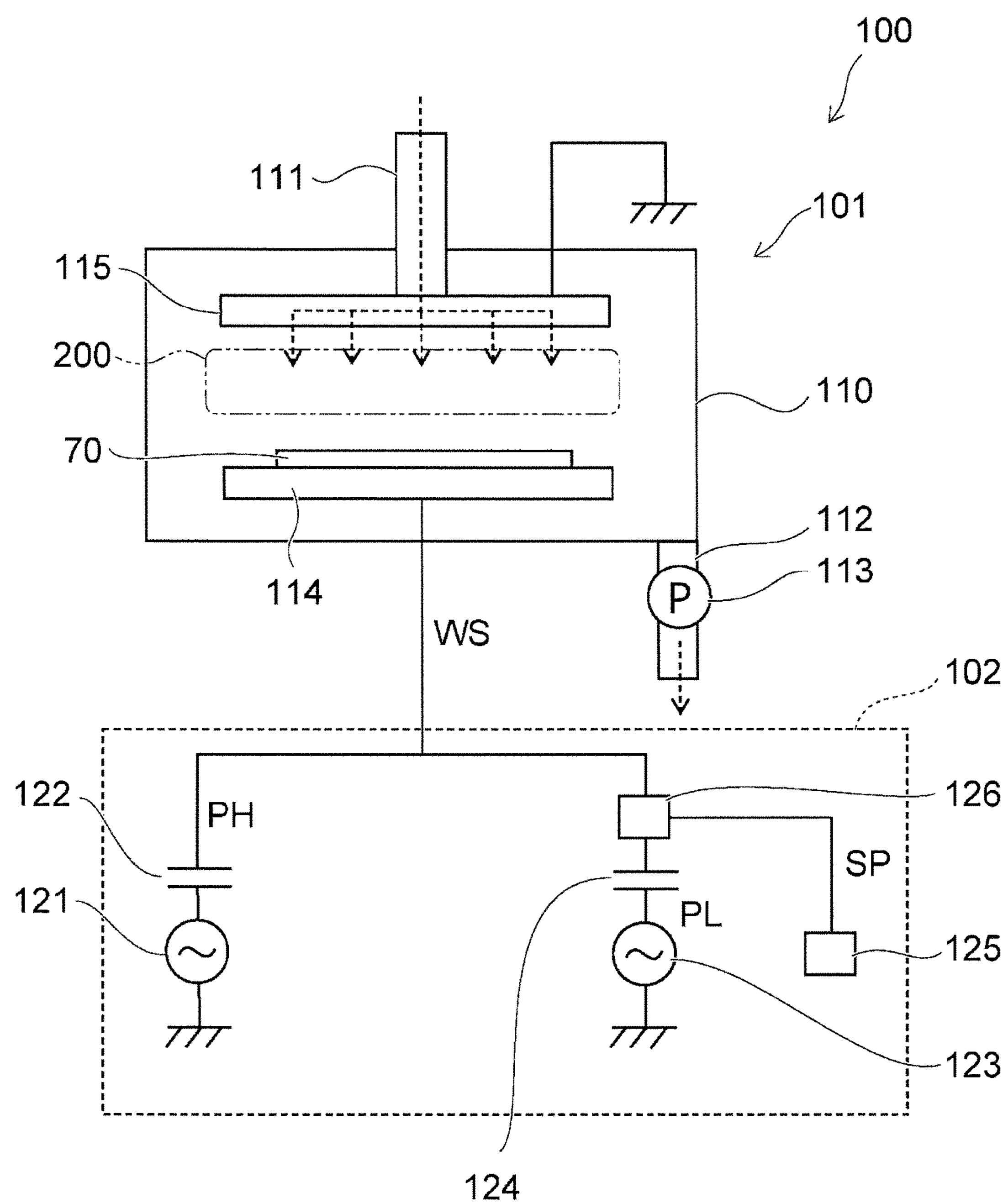
FIG. 1 is a diagram illustrating a dry etching apparatus for use in some embodiments.

FIG. 1 is a diagram illustrating the dry etching apparatus for use in some embodiments.

Furthermore, FIG. 1 illustrates the dry etching apparatus in a simplified manner as compared with the actual apparatus.

As illustrated in FIG. 1, the dry etching apparatus 100 for use in some embodiments includes a chamber 101 and a power supply unit 102. In some embodiments, the chamber 101 includes a chamber main body 110, and a gas introduction pipe 111 and a gas discharge pipe 112 are attached to the chamber main body 110. In some embodiments, the gas introduction pipe 111 and the gas discharge pipe 112 can communicate with the inside of the chamber main body 110.

In some embodiments, a pump 113 is connected to the gas discharge pipe 112. In some embodiments, various types of gases may be introduced into the chamber main body 110 through the gas introduction pipe 111. In some embodiments, as the pump 113 is driven, gases may be discharged from the chamber main body 110 through the gas discharge pipe 112.

In some embodiments, an electrode 114 and an opposite electrode 115 are arranged opposite each other in the chamber main body 110. In some embodiments, electric power may be supplied between the electrode 114 and the opposite electrode 115 from the power supply unit 102. In some embodiments, a wafer 70, which serves as a material to be processed, is placed on the electrode 114. In some embodiments, the opposite electrode 115 is connected to the gas introduction pipe 111, and gases are introduced via a plurality of blowing ports (not illustrated) provided at the opposite electrode 115.

In some embodiments, the power supply unit 102 includes a high-frequency (HF) power supply 121, a matching device 122, a low-frequency (LF) power supply 123, a matching device 124, a pulse generator 125, and a switch 126. In some embodiments, one end of the high-frequency power supply 121 is grounded, and the other end thereof is connected to one end of the matching device 122. In some embodiments, the other end of the matching device 122 is connected to the electrode 114. In some embodiments, one end of the low-frequency power supply 123 is grounded, and the other end thereof is connected to one end of the matching device 124. In some embodiments, the other end of the matching device 124 is connected to a first input terminal of the switch 126. In some embodiments, the pulse generator 125 is connected to a second input terminal of the switch 126. In some embodiments, the output terminal of the switch 126 is connected to the electrode 114.

In some embodiments, the high-frequency power supply 121 may output alternating-current power PH with a frequency of, for example, 40 MHz or more, for example, 60 MHz. In some embodiments, the low-frequency power supply 123 may output alternating-current power PL with a frequency of, for example, 20 MHz or less, for example, 2 MHz. In some embodiments, the alternating-current power PL may contain a direct-current component which is relatively negative with respect to the potential of the opposite electrode 115. In some embodiments, the pulse generator 125 may output a pulse signal SP which alternately repeats an on-state and an off-state. In some embodiments, the pulse generator 125 can optionally control the frequency and duty ratio of the pulse signal SP. Furthermore, the duty ratio refers to the ratio of an on-time to a time of one cycle. In some embodiments, the frequency of the pulse signal SP may be, for example, 1 MHZ or less, for example, 5 kHz. In some embodiments, the switch 126, to which the alternating-current power PL and the pulse signal SP are input, may output the alternating-current power PL when the value of the pulse signal SP is “on”, and may output none when the value of the pulse signal SP is “off”. In some embodiments, the matching device 122 may be a high-pass filter which prevents the alternating-current power PL from sneaking into the high-frequency power supply 121, and the matching device 124 may be a low-pass filter which prevents the alternating-current power PH from sneaking into the low-frequency power supply 123. In some embodiments, the alternating-current power PH, the alternating-current power PL, and the pulse signal SP may become a superimposed wave WS, which is then applied to the electrode 114. In some embodiments, the alternating-current power PH and the alternating-current power PL may configure radio frequency (RF) power. In some embodiments, the alternating-current power PL and the pulse signal SP may configure bias power.

Next, a method for manufacturing a semiconductor device according to some embodiments will be described.

The method for manufacturing a semiconductor device according to some embodiments is, for example, a method for manufacturing a stacked-structure semiconductor memory device, and includes a dry etching method according to some embodiments.

Figure 2A:
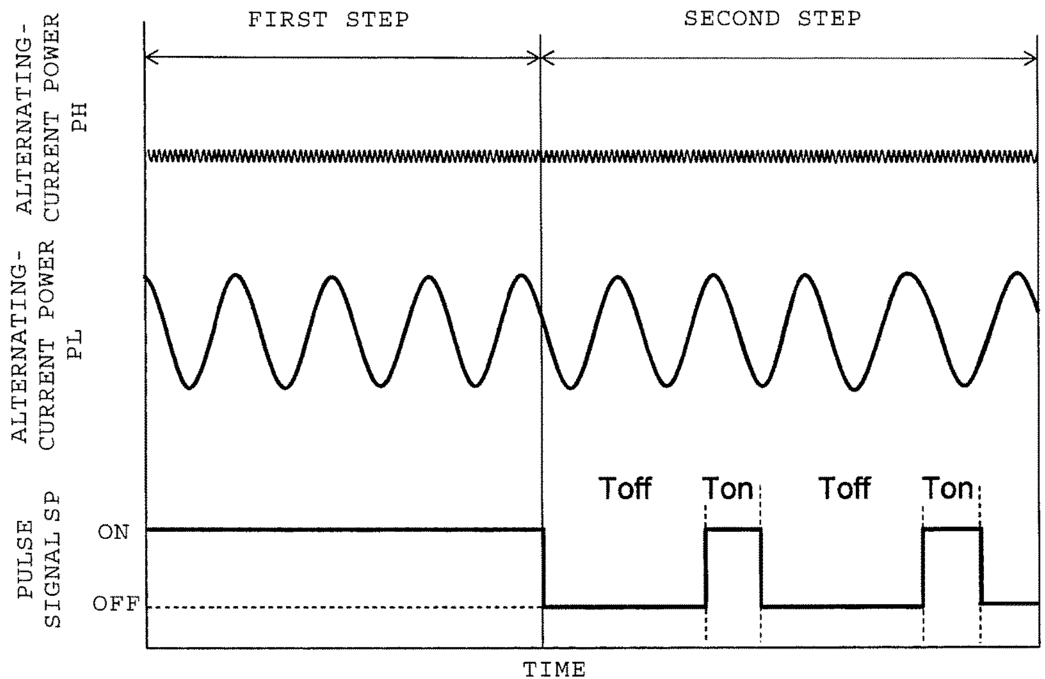
FIG. 2A, FIG. 2B, and FIG. 2C are timing charts illustrating a dry etching method according to some embodiments, with the abscissa axis taken as time and the ordinate axis taken as values of two types of electric power and a signal.
Figure 2B:
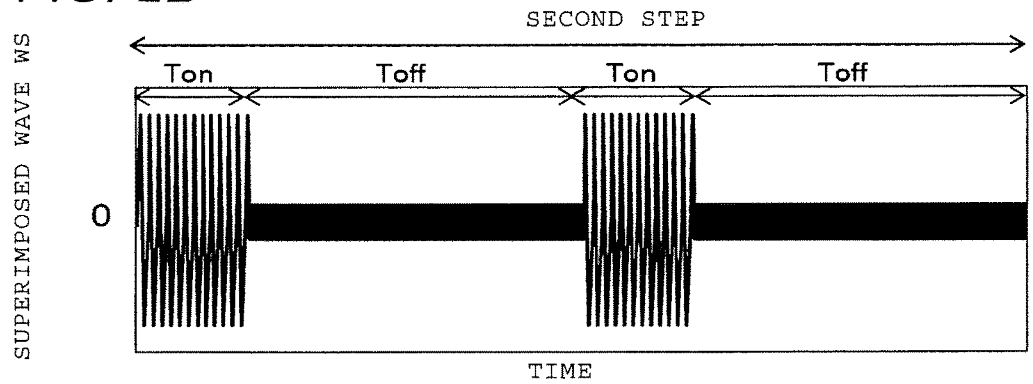
Figure 2C:
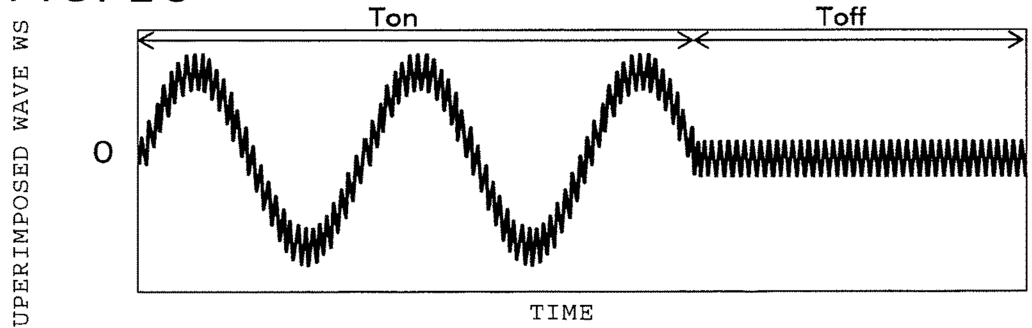

FIG. 2A, FIG. 2B, and FIG. 2C are timing charts illustrating the dry etching method according to some embodiments, with the abscissa axis taken as time and the ordinate axis taken as values of two types of electric power and a signal. FIG. 2A illustrates the respective waveforms of the alternating-current power PH, the alternating-current power PL, and the pulse signal SP. FIG. 2B illustrates the waveform of a superimposed wave WS in a second step. FIG. 2C is an enlarged view of a portion illustrated in FIG. 2B.

Figure 3:
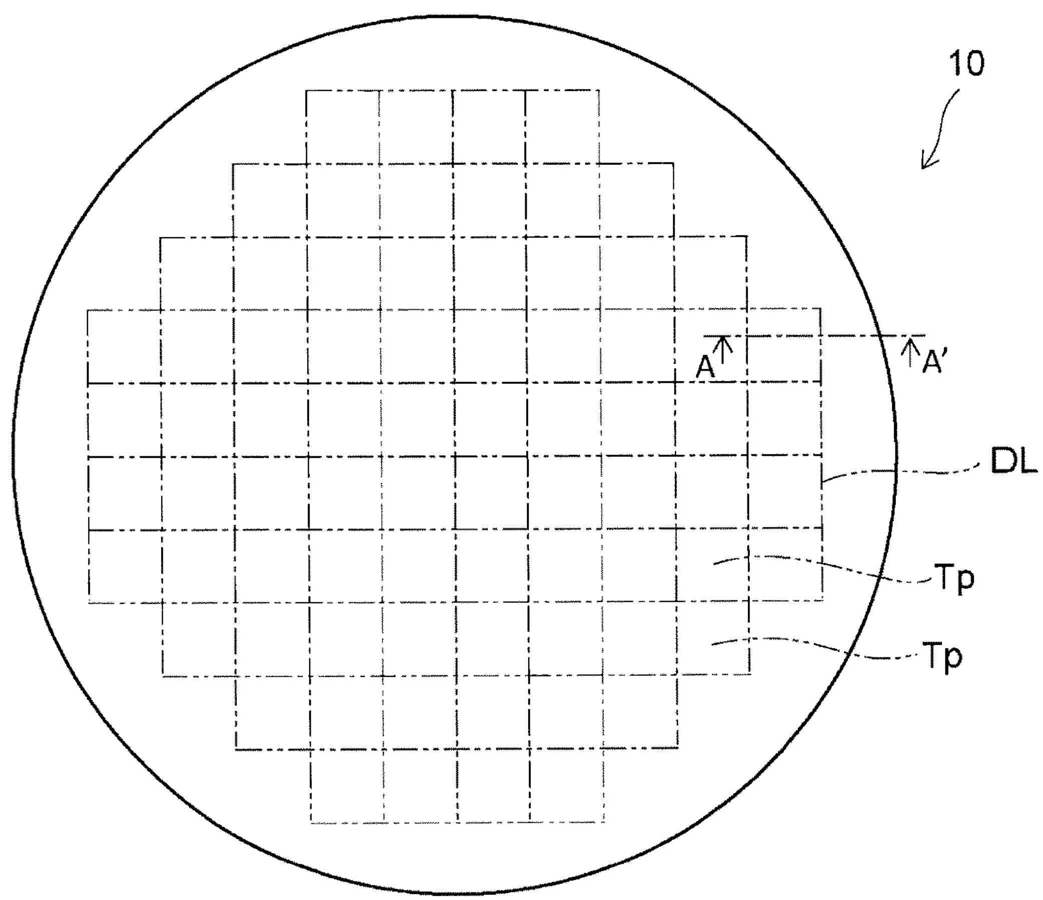
FIG. 3 is a plan view illustrating a method for manufacturing a semiconductor device according to some embodiments.

FIG. 3 is a plan view illustrating the method for manufacturing the semiconductor device according to some embodiments.

FIG. 4 to FIG. 8 are sectional views illustrating the method for manufacturing the semiconductor device according to some embodiments.

Figure 4:
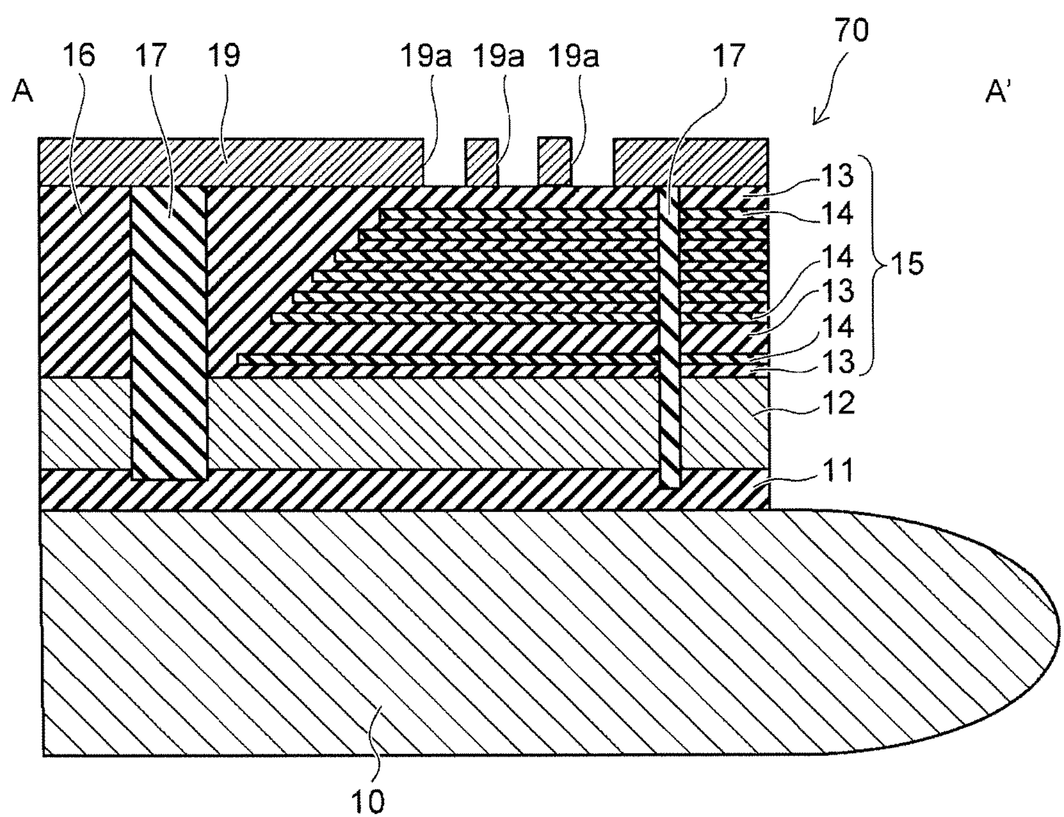
FIG. 4 is a sectional view illustrating the method for manufacturing the semiconductor device according to some embodiments.

FIG. 4 is a sectional view taken along line A-A' illustrated in FIG. 3.

Figure 9:
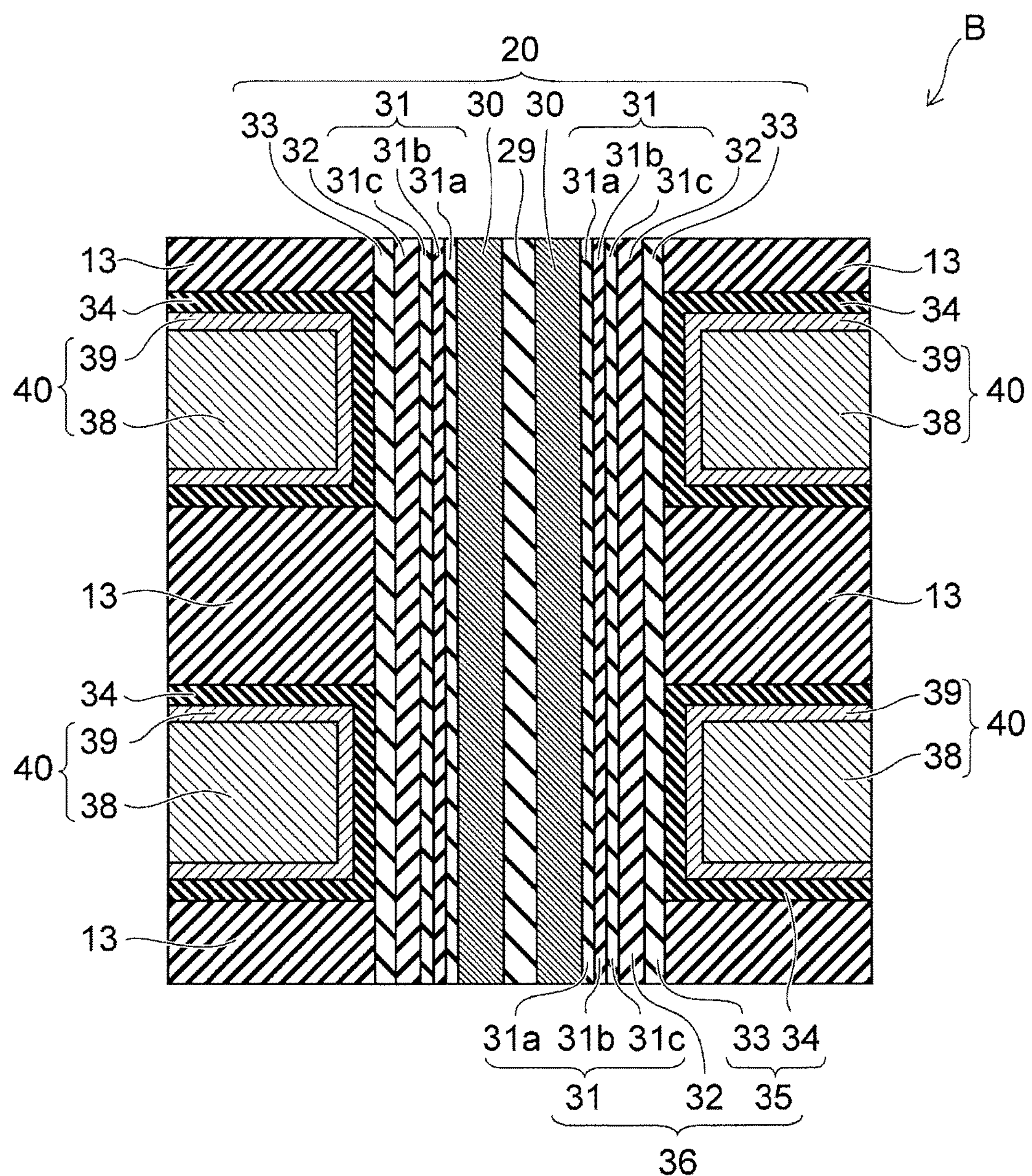
FIG. 9 is a sectional view illustrating a columnar member of the semiconductor device according to some embodiments.
Figure 10:
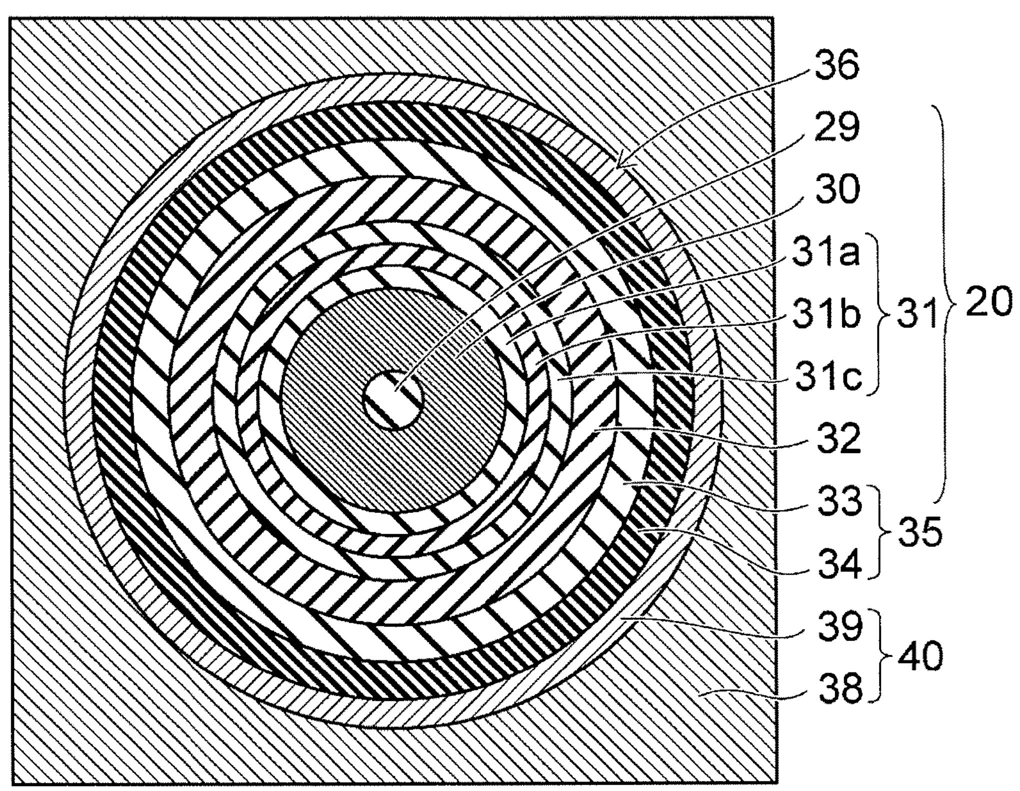
FIG. 10 is a sectional view illustrating the columnar member of the semiconductor device according to some embodiments.

FIG. 9 and FIG. 10 are sectional views illustrating a columnar member of the semiconductor device according to some embodiments.

Figure 8:
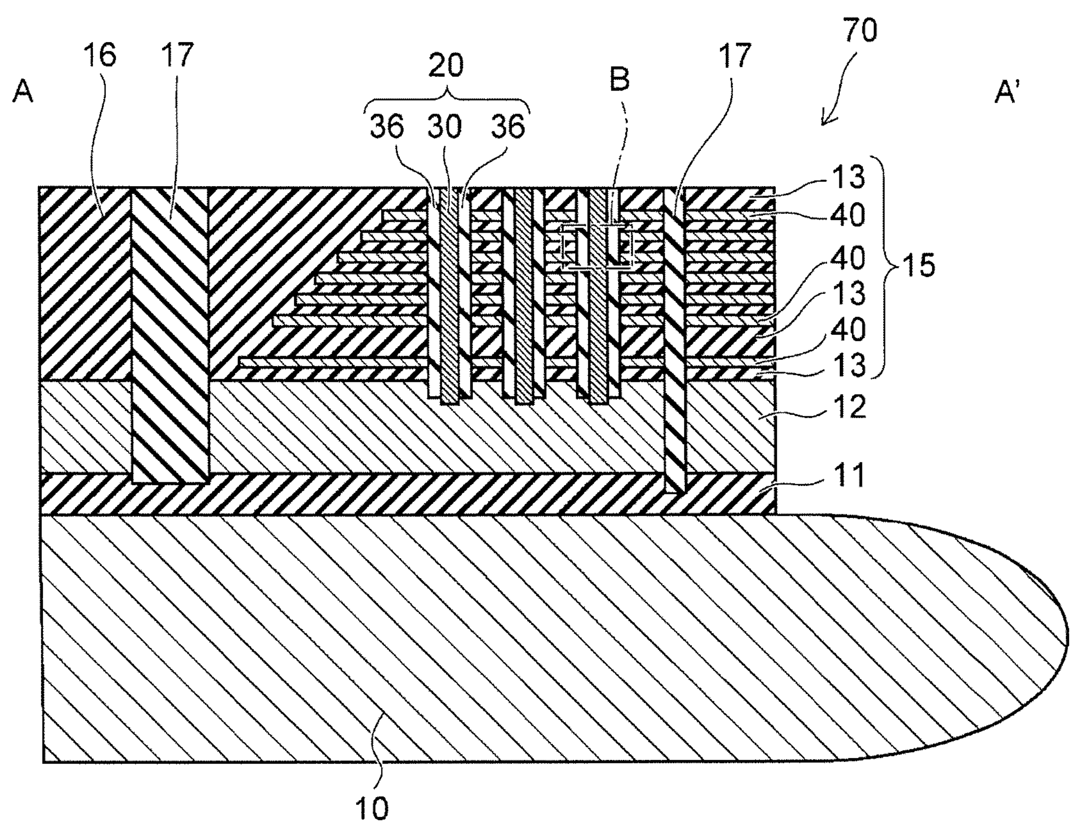
FIG. 8 is a sectional view illustrating the method for manufacturing the semiconductor device according to some embodiments.

FIG. 9 illustrates a region B illustrated in FIG. 8.

FIG. 10 illustrates a cross-section that is orthogonal to a cross-section illustrated in FIG. 9.

Furthermore, FIG. 4 to FIG. 8 are views schematically illustrating an intermediate structure of the semiconductor device, in which, for ease of visualization, the constituent elements may be illustrated as being smaller in number and larger in size than the actual ones.

First, in some embodiments, as illustrated in FIG. 3, a silicon wafer 10 is prepared. In some embodiments, lattice-like dicing lines DL are previously set on the silicon wafer 10, and a rectangular region surrounded by the dicing lines DL is a region which becomes a chip Tp after dicing. In some embodiments, a semiconductor device may be formed for every chip Tp.

In some embodiments, as illustrated in FIG. 4, an insulating film 11, which is made from, for example, silicon oxide (SiO), is formed on the silicon wafer 10. Next, in some embodiments, a conductive member 12, which is made from, for example, material of polysilicon (Si) or metal or combination thereof, is formed on the insulating film 11. Next, in some embodiments, a stacked body 15 is formed by alternately forming a silicon oxide layer 13 and a silicon nitride layer 14 one by one. Next, in some embodiments, an end portion of the stacked body 15 is processed into a staircase shape. Next, in some embodiments, an interlayer insulating film 16 is formed by depositing, for example, silicon oxide. Next, in some embodiments, planarization processing, such as chemical mechanical polishing (CMP), may be performed on the upper surfaces of the stacked body 15 and the interlayer insulating film 16.

Next, in some embodiments, lattice-like trenches are formed at regions including the dicing lines DL (FIG. 3) of the silicon wafer 10, and an insulating member 17 is formed by filling each trench with, for example, silicon oxide, thereby causing the conductive member 12 to be divided into every chip Tp. In some embodiments, the conductive member 12 can be divided into a plurality of blocks in each chip Tp. Next, in some embodiments, a resist pattern 19 is formed on the stacked body 15 and on the interlayer insulating film 16. In some embodiments, Hole-like apertures 19*a* are formed in the resist pattern 19. A stacked body configured with members from the silicon wafer 10 to the resist pattern 19 is referred to as a "wafer 70". In some embodiments, the conductive member 12 is divided by the insulating member 17, such that a portion of the conductive member 12 located in each chip Tp is not exposed at the external surface of the wafer 70, and is thus insulated from the external surface.

Next, in some embodiments, as illustrated in FIG. 1, the wafer 70 is placed on the electrode 114 of the dry etching apparatus 100. Then, in some embodiments, as the pump 113 is driven, the air in the chamber main body 110 may be discharged through the gas discharge pipe 112, and, at the same time, a mixed gas including a fluorine-containing gas, such as $CF_4$, $CH_2F_2$, $C_4F_6$, $C_4F_8$, $SF_6$, or $NF_3$, oxygen gas ($O_2$), and a noble gas, such as argon gas (Ar), may be introduced into the chamber main body 110 through the gas introduction pipe 111. In some embodiments, as the fluorine-containing gas, for example, octafluorocyclobutane gas ($C_4F_8$) may be introduced.

In this state, in some embodiments, the power supply unit 102 of the dry etching apparatus 100 may be driven to supply electric power to the electrode 114. Then, in some embodiments, a first step illustrated in FIG. 2A to FIG. 2C is performed. In some embodiments, the alternating-current power PH may be output from the high-frequency power supply 121, and the alternating-current power PL may be output from the low-frequency power supply 123. in some embodiments, a signal which is constantly in an on state may be output from the pulse generator 125. In some embodiments, a pulse signal SP with a duty ratio of 100% at an optional frequency may be output, thereby applying to the electrode 114 a superimposed wave WS obtained by the alternating-current power PH, the alternating-current power PL, and the pulse signal SP being superimposed on each other. As a result, in some embodiments, an etching gas can be ionized into cations and anions, and plasma 200 can be generated in the chamber main body 110. Then, in some embodiments, cations in the plasma 200 can be accelerated toward the wafer 70 by bias power to etch the wafer 70. Table 1 shows an example of conditions in the first step.

TABLE 1

| | | |
|---|---|---|
| Pressure | | 20 mT |
| Alternating-current power PH | Frequency | 60 MHz |
| | Power | 2,000 W |
| Alternating-current power PL | Frequency | 2 MHz |
| | Power | 17,000 W |
| Pulse signal SP | Frequency | — |
| | Duty ratio | 100% |
| Gas flow rate | $C_4F_8$ | 120 sccm |
| | $O_2$ | 100 sccm |
| | Ar | 60 sccm |
| Processing time | | 70 sec |

Figure 5:
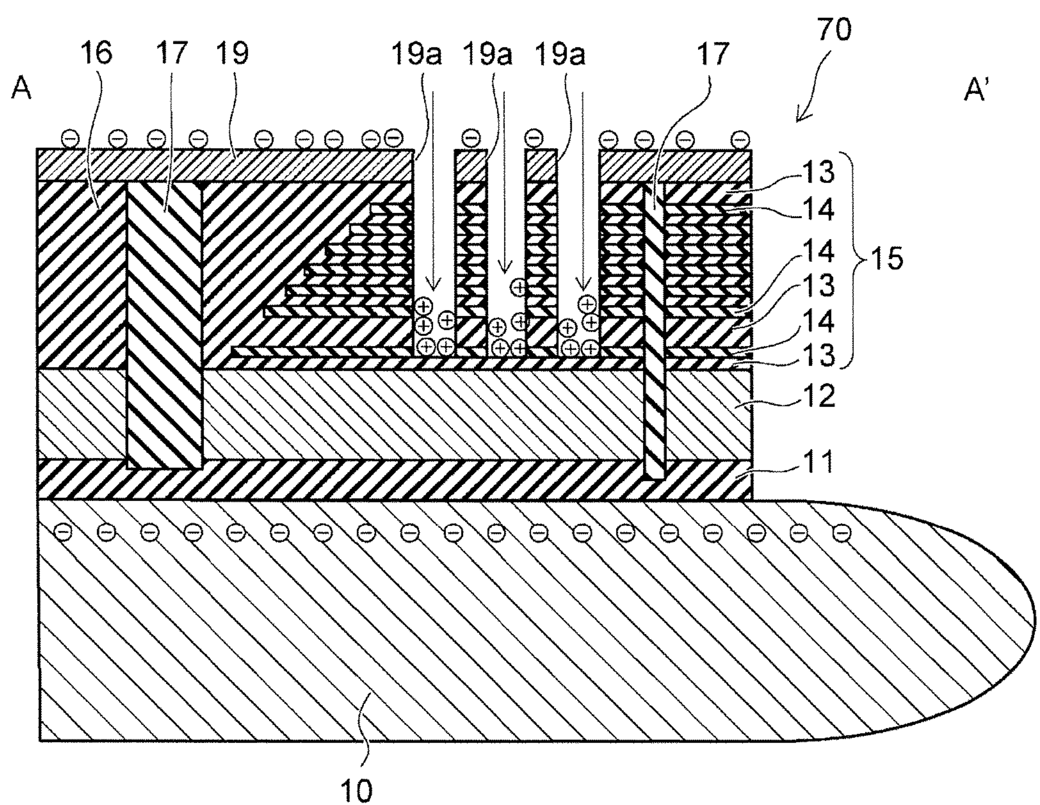
FIG. 5 is a sectional view illustrating the method for manufacturing the semiconductor device according to some embodiments.

In some embodiments, as illustrated in FIG. 5, the resist pattern 19 is used as a mask to etch the stacked body 15. As a result, in some embodiments, memory holes MH are formed in the stacked body 15. At this time, in some embodiments, the silicon wafer 10 may be electrically charged with negative charges by the electrode 114, so that the potential Vs of the silicon wafer 10 becomes negative. In some embodiments, the potential of the surface of the wafer 70 may become equal to the potential Vs of the silicon wafer 10. Furthermore, in FIG. 5 to FIG. 7, cations are expressed by a mark "+" surrounded by a circle, and electrons are expressed by a mark "–" surrounded by a circle.

In some embodiments, cations in the plasma 200 may be approximately vertically drawn into the memory holes MH by bias power. At this time, in some embodiments, although electrons in the plasma 200 also enter the memory holes MH by disorderly motion, the amount of entry of electrons may be less than the amount of entry of cations. Therefore, in some embodiments, along with the advancement of etching, the bottom surface of the memory hole MH may be electrically charged with positive charges, so that the potential Vb of the bottom surface of the memory hole MH becomes positive with respect to the potential Vs. As a result, the absolute value $|\Delta Vsb|$ of a potential difference $\Delta Vsb$ between the potential Vs of the silicon wafer 10 and the potential Vb of the bottom surface of the memory hole MH may increase in dependence upon a discharge time.

Accordingly, in some embodiments, the first step may be ended while the silicon oxide layer 13 and the silicon nitride layer 14 located at an area directly below the memory hole MH in the stacked body 15 remain. Therefore, in some embodiments, insulation breakdown does not occur in the insulating film 11 due to the potential difference $\Delta Vsb$. In some embodiments, in the first step, the memory hole MH does not penetrate through the stacked body 15 and does not extend to the conductive member 12. In some embodiments, in the first step, a majority of the memory hole MH, for example, a portion that occupies half or more of the thickness of the stacked body 15, may be formed. In some embodiments, the conditions of the first step may be determined with importance placed on etching rate and processing shape.

Next, in some embodiments, a second step illustrated in FIG. 2A to FIG. 2C is performed. In the second step, in some embodiments, unlike the first step, the frequency of the pulse signal Sp may be set to, for example, 5 kHz, and the duty ratio thereof may be set to, for example, 25%. With this, in some embodiments, the length of an on-period Ton, in which the value of the pulse signal SP is "on", may become 50 μsec (microseconds), the length of an off-period Toff, in which the value of the pulse signal SP is "off", may become 150 μsec. Then, in some embodiments, the superimposed wave WS obtained by the alternating-current power PH, the alternating-current power PL, and the pulse signal SP being superimposed on each other may be applied to the electrode 114. Furthermore, although, in FIG. 2A, for convenience of illustration, the period of the alternating-current power PL and the period of the pulse signal SP are illustrated as being approximately equal, in some embodiments, the frequency of the alternating-current power PL may be, for example, 2 MHz and the frequency of the pulse signal SP may be, for example, 5 kHz, and, therefore, the period of the pulse signal SP may be, for example, 400 times the period of the alternating-current power PL. The same conditions in the second step may apply to FIG. 11, which is described below. Table 2 shows an example of conditions in the second step.

TABLE 2

| | | |
|---|---|---|
| Pressure | | 20 mT |
| Alternating-current power PH | Frequency | 60 MHz |
| | Power | 2,000 W |
| Alternating-current power PL | Frequency | 2 MHz |
| | Power | 17,000 W |

TABLE 2-continued

| | | |
|---|---|---|
| Pulse signal SP | Frequency | 5 kHz |
| | Duty ratio | 25% |
| Gas flow rate | $C_4F_8$ | 120 sccm |
| | $O_2$ | 100 sccm |
| | Ar | 60 sccm |
| Processing time | | 90 sec |

Figure 6:
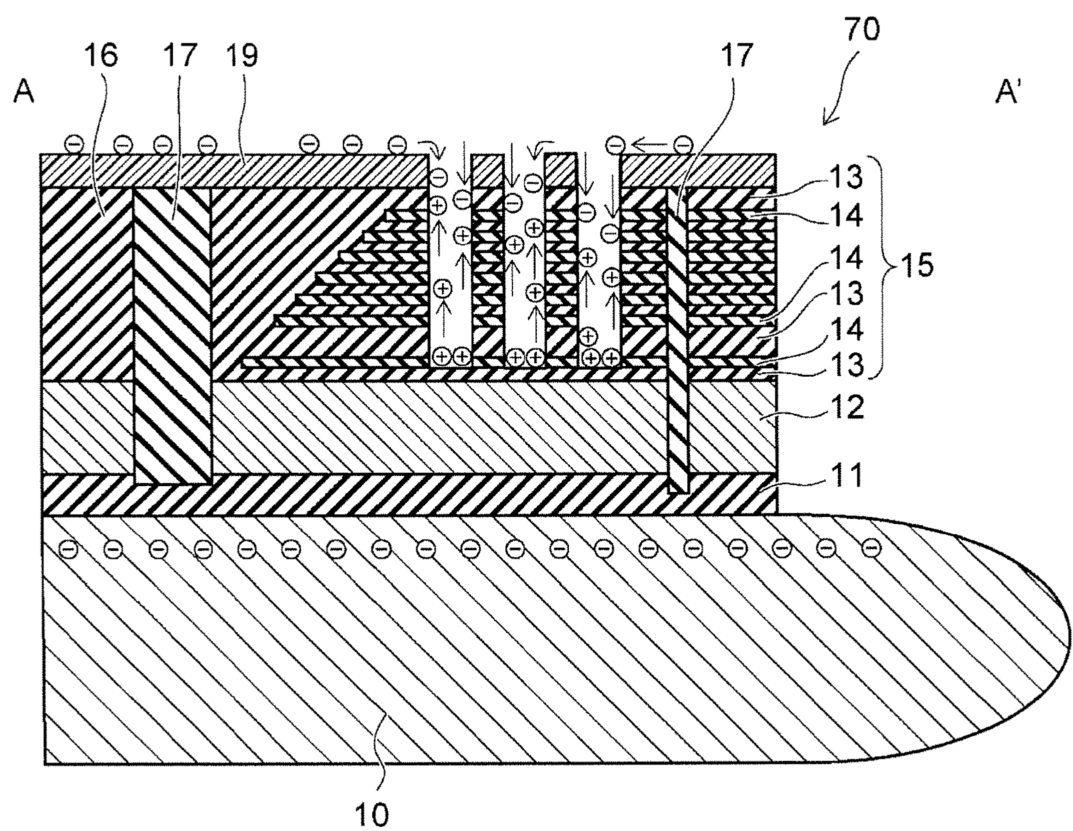
FIG. 6 is a sectional view illustrating the method for manufacturing the semiconductor device according to some embodiments.

In some embodiments, during the on-period Ton, since bias power is applied, cations may be drawn into the memory hole MH so that etching progresses, and, at the same time, positive charges are accumulated at the bottom surface of the memory hole MH. In some embodiments, during the off-period Toff, since bias power is set to zero, cations may cease to be drawn into the memory hole MH. Therefore, etching almost may cease to progress, but, as illustrated in FIG. 6, positive charges accumulated in the memory hole MH are coupled with negative charges present outside the memory hole MH so that the positive charges and the negative charges annihilate each other, and positive charges present at the bottom surface of the memory hole MH decrease. Accordingly, in some embodiments, repeating the on-period Ton and the off-period Toff allows etching to progress while preventing positive charges from being accumulated at the bottom surface of the memory hole MH and preventing the absolute value of the potential difference ΔVsb from increasing.

Figure 7:
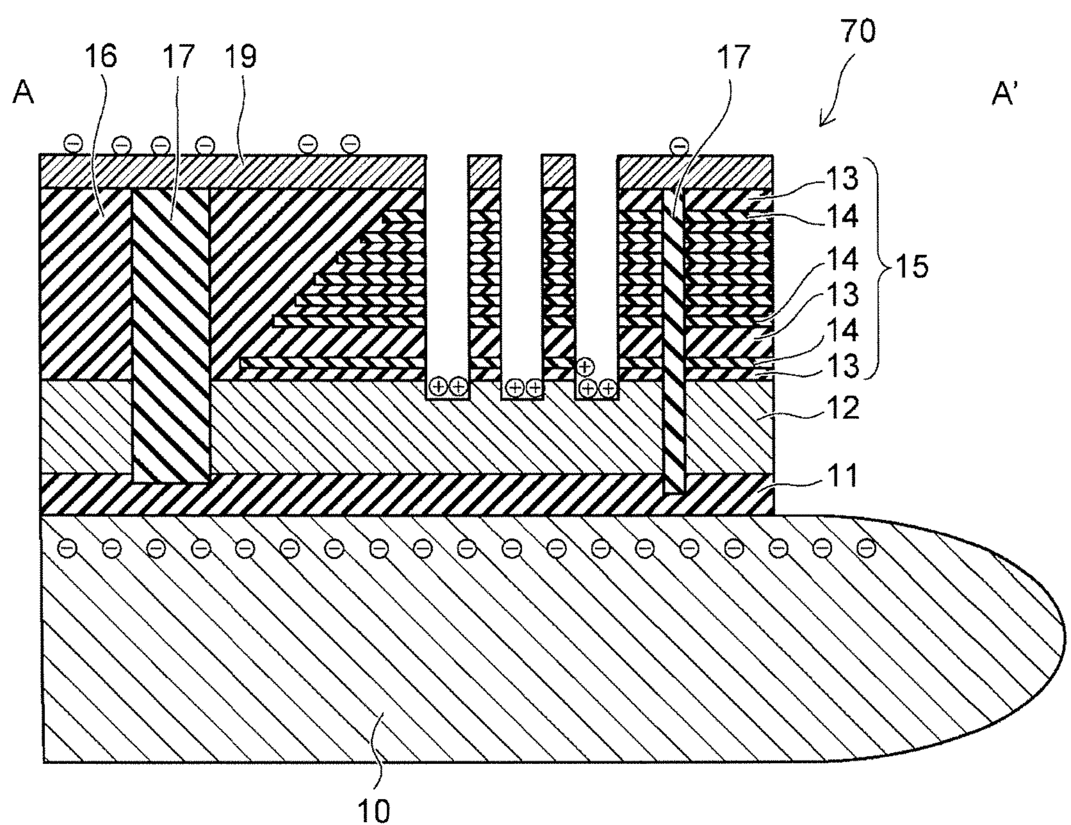
FIG. 7 is a sectional view illustrating the method for manufacturing the semiconductor device according to some embodiments.

As a result, in some embodiments, as illustrated in FIG. 7, the memory hole MH is allowed to extend to the conductive member 12 while insulation breakdown is not allowed to occur at an area directly below the memory hole MH in the stacked body 15. At this time, in some embodiments, positive charges accumulated at the bottom surface of the memory hole MH may flow into the conductive member 12, so that the conductive member 12 is electrically charged with positive charges. In some embodiments, the silicon wafer 10 may be electrically charged with negative charges. Accordingly, although a voltage is applied to the insulating film 11, since positive charges at the bottom surface of the memory hole MH are decreased in the above-mentioned second step, the voltage to be applied to the insulating film 11 may be also reduced, so that insulation breakdown can be prevented from occurring at the insulating film 11. In some embodiments, in order to surely prevent insulation breakdown from occurring at the stacked body 15 and the insulating film 11, it is desirable that the on-period Ton be set to 50 μsec or less, the off-period Toff be set to 50 μsec or more, and the duty ratio of the pulse signal SP be set to 50% or less. In some embodiments, at the point of time when the memory hole MH surely arrives at the conductive member 12, the second step may be stopped and etching may be ended. In some embodiments, the diameter of the memory hole MH may be, for example, 150 nm (nanometers), and the aspect ratio thereof may be greater than 5.

In some embodiments, in the second step, if the duty ratio of the pulse signal SP is too low, since the on-period Ton becomes shorter, the etching speed may decrease so that processing does not progress, or the side surface of the memory hole MH inclines from the vertical surface so that the processing shape deteriorates. In some embodiments, if the duty ratio is too high, since the off-period Toff becomes shorter, the potential difference ΔVsb may become larger, so that the possibility of occurrence of insulation breakdown increases. Therefore, in some embodiments, the duty ratio of the pulse signal SP may be set within the range in which securing of an etching characteristic and lessening of the potential difference ΔVsb are compatible with each other.

Next, in some embodiments as illustrated in FIG. 8, the wafer 70 is extracted from the dry etching apparatus 100. Then, in some embodiments, a columnar member 20 is formed in the memory hole MH. Hereinafter, this process and the structure of the columnar member 20 will be described in detail.

In some embodiments as illustrated in FIG. 9 and FIG. 10, at the bottom surface of the memory hole MH, silicon may be epitaxially grown with the conductive member 12 set as a starting point to form an epitaxial silicon member (not illustrated). Next, in some embodiments, a silicon oxide layer 33 is formed on the inner surface of the memory hole MH. Next, in some embodiments, a charge storage film 32 is formed by depositing silicon nitride (SiN). Next, in some embodiments, a tunnel insulating film 31 is formed by depositing silicon oxide, silicon nitride, and silicon oxide in this order to form a silicon oxide layer 31*c*, a silicon nitride layer 31*b*, and a silicon oxide layer 31*a*.

Next, in some embodiments, a cover silicon layer (not illustrated) may be formed by depositing silicon, and reactive ion etching (RIE) may be performed to remove the cover silicon layer, the tunnel insulating film 31, the charge storage film 32, and the silicon oxide layer 33, so that the epitaxial silicon member is exposed. Next, in some embodiments, a body silicon layer may be formed by depositing silicon. In some embodiments, the body silicon layer may be in contact with the epitaxial silicon member and the tunnel insulating film 31. In some embodiments, a silicon pillar 30 is formed of the cover silicon layer and the body silicon layer. Next, in some embodiments, a core member 29 is formed by depositing silicon oxide. In some embodiments, the memory hole MH is finally filled with the core member 29, thereby forming the columnar member 20.

Next, in some embodiments as illustrated in FIG. 8, a slit (not illustrated) may be formed in the stacked body 15. In some embodiments, the slit may penetrate through the stacked body 15. Next, in some embodiments, wet etching using, for example, hot phosphoric acid may be performed to remove the silicon nitride layer 14 (see FIG. 7) via the slit, thereby forming a space between the silicon oxide layers 13.

Next, in some embodiments as illustrated in FIG. 9 and FIG. 10, an aluminum oxide layer 34 is formed on the inner surface of the space by depositing aluminum oxide via the slit. In some embodiments, a block insulating film 35 is configured with the silicon oxide layer 33 and the aluminum oxide layer 34. In some embodiments, a memory film 36 is formed of the tunnel insulating film 31, the charge storage film 32, and the block insulating film 35.

Next, in some embodiments, a barrier metal layer 39 is formed on the aluminum oxide layer 34 by depositing titanium nitride and titanium via the slit. Next, in some embodiments, a main body portion 38 is formed by depositing tungsten in the space via the slit. Next, in some embodiments, etching may be performed to remove tungsten, titanium, titanium nitride, and aluminum oxide from within the slit and to allow tungsten, titanium, titanium nitride, and aluminum oxide to remain only within the space, thereby forming in the space an electrode film 40, which includes the main body portion 38 and the barrier metal layer 39. In this way, in some embodiments, the silicon nitride layer 14 is substituted with the electrode film 40. Next, in some embodiments, as illustrated in FIG. 3, the wafer 70 is cut along the dicing lines DL to be divided into a plurality of chips Tp, thereby manufacturing a semiconductor device.

Next, advantageous effects of some embodiments will be described.

In some embodiments, dry etching for forming the memory holes MH may be performed divisionally in the first step and the second step. In some embodiments, the first step may be performed from the start of etching until immediately before the memory hole MH penetrates through the stacked body 15, and then, the second step may be performed until the end of etching.

Then, in some embodiments, the conditions of the first step can be determined with importance placed on etching rate and processing shape. In some embodiments, the value of pulse signal SP may be constantly set to "on", and the alternating-current power PL may be continuously applied, thereby precisely and efficiently performing etching on the stacked body 15. In some embodiments, since the conditions of the second step are determined with lessening of the potential difference ΔVsb taken into consideration, etching can be ended while insulation breakdown of the stacked body 15 and the insulating film 11 can be prevented. As a result, in some embodiments, memory holes MH with high aspect ratios can be stably formed.

In some embodiments, if the memory holes MH are formed only in the first step, positive charges may be progressively accumulated at the bottom surface of the memory hole MH, and the absolute value of the potential difference ΔVsb may increase according to a discharge time. As a result, in some embodiments, immediately before the memory hole MH arrives at the conductive member 12, arcing may occur in the insulating film 11 and insulation breakdown thereof may occur.

In some embodiments, if the memory holes MH are formed only in the first step, positive charges may be progressively accumulated at the bottom surface of the memory hole MH, and the absolute value of the potential difference ΔVsb may increase according to a discharge time. As a result, in some embodiments, when the memory hole MH arrives at the conductive member 12, positive charges accumulated at the bottom surface of the memory hole MH may be injected into the conductive member 12, so that a voltage is generated between the silicon wafer 10 and the conductive member 12 and an electric field is applied to the insulating film 11. As a result, in some embodiments, arcing may occur in the insulating film 11 and insulation breakdown thereof may occur.

In some embodiments, if arcing occurs with a large amount of positive charges accumulated at the bottom surface of the memory hole MH or the conductive member 12, a large current may flow through a portion in which insulation breakdown occurs, and large Joule heat may be generated there. In some embodiments, when the temperature of the current pathway exceeds the melting point of silicon oxide (about 1,600° C.), a structure around the current pathway may be melted. As a result, in some embodiments, a portion larger than the portion at which insulation breakdown merely occurs may be broken.

In some embodiments, the respective conditions of the first step and the second step are not limited to the examples shown in the above Table 1 and Table 2. For example, in the first step, the duty ratio of the pulse signal SP can be set to less than 100%, and a period in which the alternating-current power PL is not applied can be provided. In this case, in some embodiments, the duty ratio of the pulse signal SP in the first step can be set higher than the duty ratio of the pulse signal SP in the second step and can be set to, for example, 50% or more.

Figure 11:
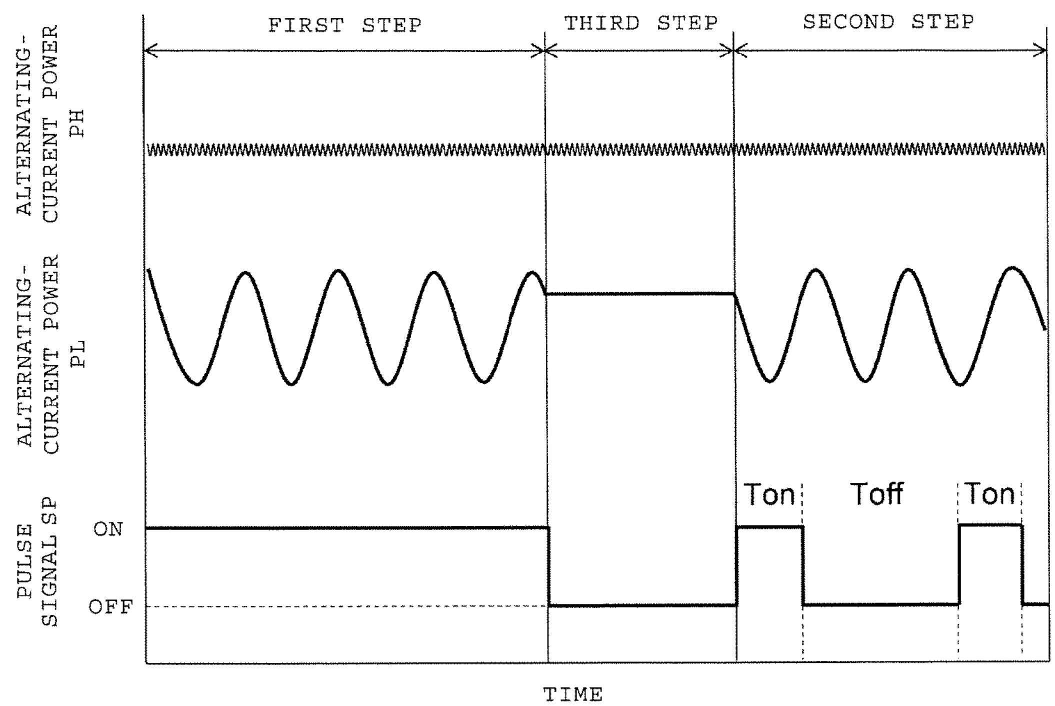
FIG. 11 is a timing chart illustrating a dry etching method according to some embodiments, with the abscissa axis taken as time and the ordinate axis taken as values of two types of electric power and a signal.

FIG. 11 is a timing chart illustrating a dry etching method according to some embodiments with the abscissa axis taken as time and the ordinate axis taken as values of two types of electric power and a signal.

As illustrated in FIG. 11, a method for manufacturing a semiconductor device according to some embodiments differs from that of the embodiments illustrated in FIG. 1 through FIG. 10 in that a third step is provided between the first step and the second step. Thus, dry etching according to some embodiments may be performed in the order of the first step, the third step, and the second step. The contents of the first step and the second step in some embodiments are respectively the same as the contents of the first step and the second step in the embodiments illustrated in FIG. 1 through FIG. 10. Table 3 shows an example of conditions in the third step.

TABLE 3

| | | |
|---|---|---|
| Pressure | | 20 mT |
| Alternating-current power PH | Frequency | 60 MHz |
| | Power | 2,500 W |
| Alternating-current power PL | Frequency | 2 MHz |
| | Power | 0 W |
| Pulse signal SP | Frequency | — |
| | Duty ratio | — |
| Gas flow rate | $C_4F_8$ | 0 sccm |
| | $O_2$ | 0 sccm |
| | Ar | 200 sccm |
| Processing time | | 10 sec |

In some embodiments as illustrated in FIG. 11 and shown in Table 3, after the first step ends, $C_4F_8$ gas and $O_2$ gas may be stopped from being supplied, and the flow rate of argon gas (Ar) may be increased from 60 sccm to 200 sccm. In some embodiments, the low-frequency power supply 123 may stop outputting the alternating-current power PL (e.g., 2 MHz), and the high-frequency power supply 121 may increase the output of the alternating-current power PH (e.g., 60 MHz) from 2,000 W to 2,500 W, for example. With this setting, in some embodiments, the third step may be started.

In some embodiments, in the third step, since the alternating-current power PL is stopped, the alternating-current power PL may cease to be supplied to the electrode 114 irrespective of the value of the pulse signal SP. Accordingly, in some embodiments, the frequency and duty ratio of the pulse signal SP are optional. In some embodiments, while the low-frequency power supply 123 outputs the alternating-current power PL, the pulse generator 125 can set the value of the pulse signal SP constantly to "off", in other words, can set the duty ratio to 0% at an optional frequency. In some embodiments, since the alternating-current power PH continues being supplied, the plasma 200 may be maintained. However, in some embodiments, since the alternating-current power PL is stopped, bias power may cease to be applied, so that cations cease to be drawn into the memory hole MH.

Figure 12:
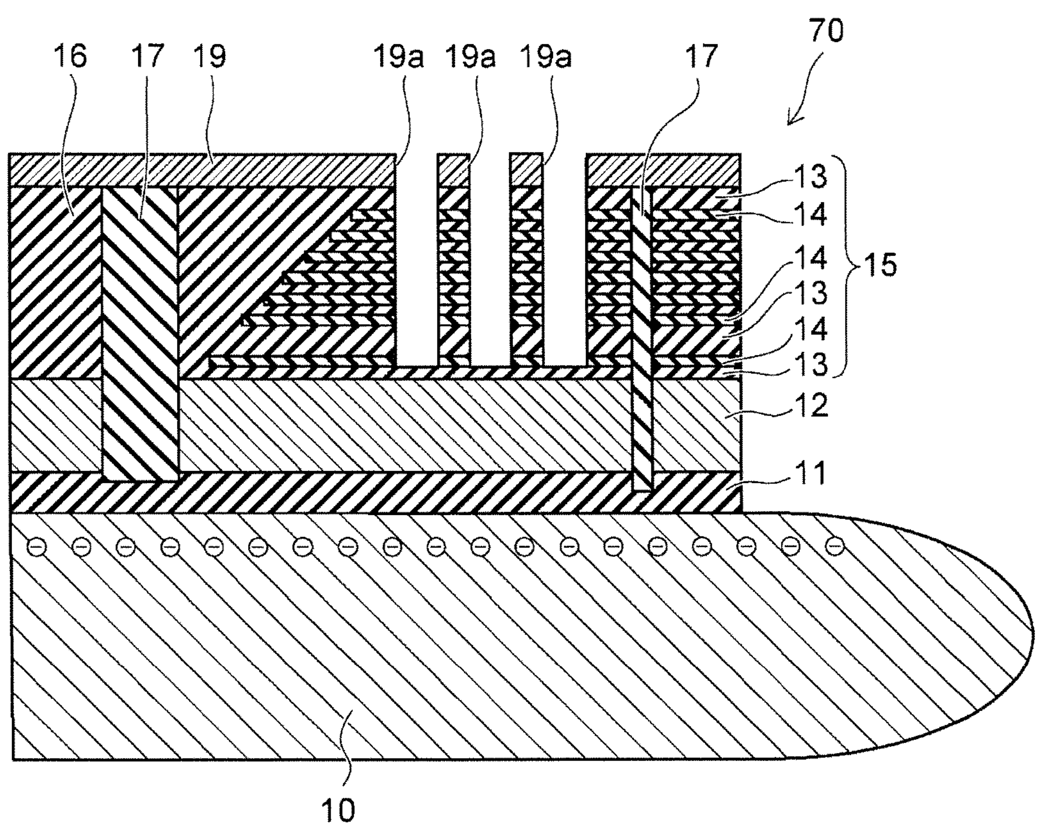
FIG. 12 is a sectional view illustrating a method for manufacturing a semiconductor device according to some embodiments.

In some embodiments as illustrated in FIG. 12, positive charges accumulated at the bottom surface of the memory hole MH in the first step may be coupled with negative charges present outside the memory hole MH so that the positive charges and the negative charges annihilate each other. As a result, in some embodiments, the absolute value of the potential difference ΔVsb may decrease. At this time, in some embodiments, $C_4F_8$ gas and $O_2$ gas may be stopped from being supplied, so that the inside of the chamber main body 110 is substituted with argon gas. As a result, in some embodiments, isotropic etching by radical species of $C_4F_8$ gas and $O_2$ gas can be prevented. In this way, in some embodiments, at least a part of positive charges accumulated at the bottom surface of the memory hole MH in the first step may be annihilated in the third step.

With this state, in some embodiments, the dry etching method may transition to the second step. I In some embodiments as illustrated in FIG. 11 and shown in Table 2, supplying $C_4F_8$ gas and $O_2$ gas may be restarted, and the flow rate of argon gas may be decreased from 200 sccm to 60 sccm. With this setting, in some embodiments, reactive cations may increase in the plasma 200. In some embodiments, outputting the alternating-current power PL (e.g., 2 MHZ) may be restarted, and the output of the alternating-current power PH (e.g., 60 MHz) may be decreased from 2,500 W to 2,000 W, for example. Then, in some embodiments, a pulse signal SP with a frequency of 5 kHz and a duty ratio of 25% may be output. With this setting, in some embodiments, the second step may progress, so that the remaining portion of the memory hole MH is formed.

Next, advantageous effects of some embodiments will be described.

In some embodiments, as the third step is performed after the first step, positive charges accumulated at the bottom surface of the memory hole MH in the first step may be annihilated, so that the absolute value of the potential difference ΔVsb is reduced. After that, in some embodiments, the second step may be performed, thereby more effectively preventing the occurrence of arching in the second step. In some embodiments, since the alternating-current power PH is increased, lessening of the potential difference ΔVsb can be further promoted.

In some embodiments, methods other than those of the embodiments illustrated in FIG. 11 and FIG. 12 are similar to those of the embodiments illustrated in FIG. 1 through FIG. 10.

Furthermore, in some embodiments, the above-described dry etching method can be applied when memory holes are formed in a process for manufacturing a stacked-structure semiconductor memory device. In some embodiments, in a process for manufacturing a stacked-structure semiconductor memory device, the above-described dry etching method can be applied when memory holes for connection to the electrode film 40 are formed in the interlayer insulating film 16. In some embodiments, the dry etching methods according to the embodiments illustrated in FIG. 1 through FIG. 12 can be applied when slits are formed in the stacked body 15. In some embodiments, in a process for manufacturing a semiconductor device other than a stacked-structure semiconductor memory device, the dry etching method according to the embodiments illustrated in FIG. 1 through FIG. 12 can be applied when holes or slits are formed.

In some embodiments, in a structure in which a first conductive member, a first insulating film, a second conductive member, and a second insulating film are stacked in layers in this order and in which the second conductive member is not exposed at the surface of the structure, the methods according to the embodiments illustrated in FIG. 1 through FIG. 12 can be applied when apertures, such as holes or slits, are formed by use of an ion species from the second insulating film to the second conductive member, so that arcing in the second insulating film and the first insulating film can be prevented. In some embodiments, while a structure serving as a target for etching may be provided with a configuration such as a lightning rod for discharging charges of the second conductive member, the methods according to the embodiments illustrated in FIG. 1 through FIG. 12 can also be applied to such a structure. In some embodiments, the methods according to the embodiments illustrated in FIG. 1 through FIG. 12 can be especially effective for a case of etching a structure which is not provided with such a configuration.

In some embodiments, if holes or slits are formed only in the first step without the second step being performed, in a case where the diameter of the hole or the width of the slit is 150 nm or less and the aspect ratio thereof is greater than 5, the occurrence of arching may become conspicuous. Therefore, the advantageous effects of the methods according to the embodiments illustrated in FIG. 1 through FIG. 12 are especially great for such processing.

In some embodiments, the switch 126 may be used to output the alternating-current power PL in the on-period Ton of the second step and not to output the alternating-current power PL in the off-period Toff thereof. In some embodiments, an output modulator such as a filter can be provided instead of the switch 126 and weak alternating-current power PL can be output in the off-period Toff. In some embodiments, if the output of the alternating-current power PL in the off-period Toff is sufficiently smaller than the output of the alternating-current power PL in the on-period Ton, substantially the same advantageous effects as in a case where the alternating-current power PL is interrupted can be obtained.

Test Example 1

Next, test example 1 according to some embodiments is described.

Figure 13:
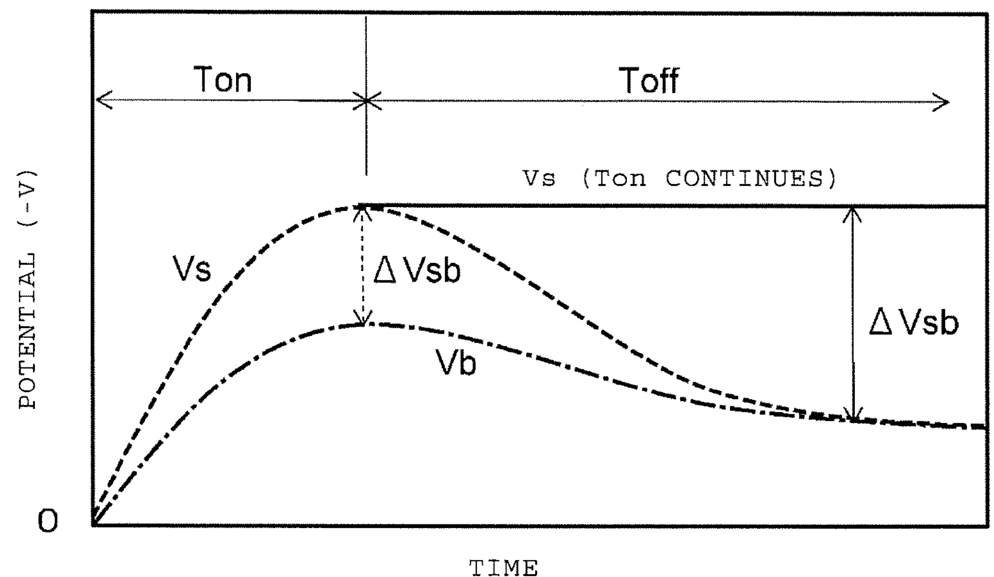
FIG. 13 is a graph illustrating changes in potential of sample portions in test example 1, with the abscissa axis taken as time and the ordinate axis taken as potentials.

FIG. 13 is a graph illustrating changes in potential of sample portions in test example 1, with the abscissa axis taken as time and the ordinate axis taken as potentials.

Figure 14:
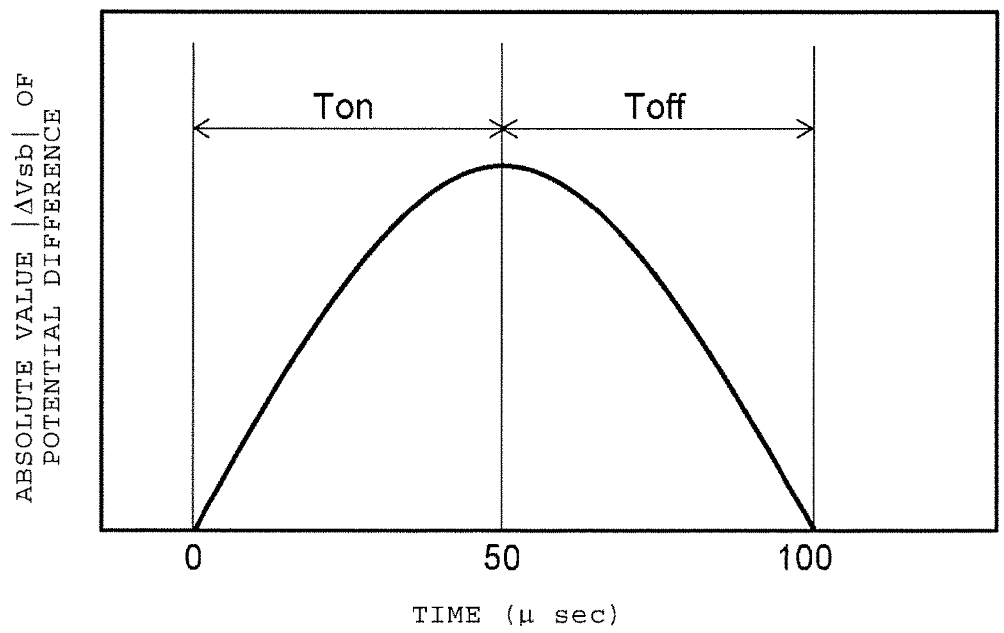
FIG. 14 is a graph illustrating changes in potential difference $\Delta Vsb$ during an on-period Ton and an off-period Toff in test example 1, with the abscissa axis taken as time and the ordinate axis taken as the absolute value of the potential difference $\Delta Vsb$.

FIG. 14 is a graph illustrating changes in the potential difference ΔVsb during the on-period Ton and the off-period Toff in test example 1, with the abscissa axis taken as time and the ordinate axis taken as the absolute value of the potential difference ΔVsb.

In test example 1, a sample similar to the wafer 70 in the embodiments illustrated in FIG. 1 through FIG. 10 was produced, etching similar to that in the second step was performed, and the potential Vs of the surface of the silicon wafer 10 and the potential Vb of the bottom surface of the memory hole MH were measured.

As a result, as illustrated in FIG. 13, both the potential Vs and the potential Vb in the initial state were 0 V and, accordingly, the potential difference ΔVsb was also 0 V. After that, as the on-period Ton, in which bias power became on, proceeded, both the potential Vs and the potential Vb became negative and the absolute values thereof increased. At that time, the rate of increase in the absolute value of the potential Vs became larger than the rate of increase in the absolute value of the potential Vb, and, accordingly, the absolute value of the potential difference ΔVsb also increased. Next, when the off-period Toff, in which bias power became off, was reached, while the values of the potential Vs and the potential Vb remained negative, the absolute values thereof decreased. At that time, the rate of decrease in the absolute value of the potential Vs became larger than the rate of decrease in the absolute value of the potential Vb, and the potential Vs and the potential Vb became almost equal. Accordingly, the absolute value of the potential difference ΔVsb decreased and then converged to 0. Furthermore, as indicated by a solid line in FIG. 13, when the on-period Ton continued, the potential Vs converged to a fixed value, and, along with the decrease of the absolute value of the potential Vb, the absolute value of the potential difference ΔVsb increased.

Moreover, when the on-period Ton was set longer than 50 μsec, arcing occurred. In the second step, when bias power continued being applied, arcing occurred at several hundreds to thousands of portions per one wafer 70. Therefore, in some embodiments, it is desirable that the on-period Ton be set to 50 μsec or less.

As illustrated in FIG. 14, when the on-period Ton was set to 50 μsec and, after that, the off-period Toff proceeded, the potential difference ΔVsb became almost 0 at the point of time when the off-period Toff passed over 50 μsec. Therefore, it is desirable that the off-period Toff be set to 50 μsec or more.

Test Example 2

Next, test example 2 according to some embodiments is described.

In test example 2, plasma simulation was performed, in which the flux of cations and the flux of electrons were calculated at the bottom surface of the memory hole MH and around the opening of the memory hole MH both in a case where bias power was "on" and in a case where bias power was "off". As a result, when bias power was "on", the flux of cations was greater than the flux of electrons at the bottom surface of the memory hole MH, and a difference between the flux of cations and the flux of electrons was smaller around the opening than at the bottom surface. Therefore, it was confirmed that a potential difference occurred between the bottom surface and the vicinity of the opening due to the accumulation of cations at the bottom surface of the memory hole MH and, since the vicinity of the opening of the memory hole MH and the silicon wafer 10 were electrically connected to each other via the outer surface of the wafer 70, a potential difference ΔVsb occurred.

According to some embodiments, a dry etching method and a method for manufacturing a semiconductor device which are capable of stably forming apertures with high aspect ratios can be implemented.

In the description of some embodiments, an element provided "on" another element can encompass cases where the former element is directly on (e.g., in physical contact with) the latter element, as well as cases where one or more intervening elements are located between the former element and the latter element.

While certain embodiments have been described, these embodiments have been presented by way of example only, and are not intended to limit the scope of the present disclosure. Indeed, the embodiments described herein may be embodied in a variety of other forms; furthermore, various omissions, substitutions and changes in the form of the embodiments described herein may be made without departing from the spirit of the present disclosure. The accompanying claims and their equivalents are intended to cover such forms or modifications as would fall within the scope and spirit of the present disclosure.

What is claimed is:

1. A dry etching method comprising:

a first process of, while applying bias power to a material to be processed including a first conductive member, a first insulating film provided on the first conductive member, a second conductive member provided on the first insulating film, and a second insulating film provided on the second conductive member, dry etching the second insulating film to expose the second conductive member by using an ion species generated by applying the bias power, wherein the bias power is applied during a first period, a time for which is set to 50 microseconds or less, wherein the bias power is applied during a second period such that a ratio of the first period to a time for the second period is set to 50% or less, wherein the second conductive member is electrically insulated from the first conductive member, wherein the bias power applied during the first period is a superimposed wave of first alternating-current power with a first frequency, second alternating-current power with a second frequency lower than the first frequency, and a pulse signal with a third frequency lower than the second frequency.

2. The dry etching method according to claim 1, wherein the time for the second period is set to 50 microseconds or more.

3. The dry etching method according to claim 1, wherein the second conductive member is not exposed at a surface of the material to be processed.

4. The dry etching method according to claim 1, further comprising:

before the first process, a second process of, while applying bias power using an ion species, etching the second insulating film without exposing the second conductive member, wherein the a duty ratio of the bias power of the second process is set to 100%.

5. The dry etching method according to claim 4, wherein, in the second process, the bias power is continuously applied or is intermittently applied at a duty ratio higher than the ratio of the time for the first period to the time for the second period.

6. The dry etching method according to claim 4, further comprising:

after the second process and before the first process, a third process of not applying bias power.

7. A method for manufacturing a semiconductor device, comprising:

a first process of, while applying bias power to a material to be processed including a first conductive member, a first insulating film provided on the first conductive member, a second conductive member provided on the first insulating film, and a second insulating film provided on the second conductive member, etching the second insulating film to expose the second conductive member by using an ion species generated by applying the bias power, wherein the bias power is applied during a first period, a time for which is set to 50 microseconds or less, wherein the bias power is applied during a second period such that a ratio of the time for the first period to a time for the second period is set to 50% or less, wherein the second conductive member is electrically insulated from the first conductive member, wherein the bias power applied during the first period is a superimposed wave of first alternating-current power with a first frequency, second alternating-current power with a second frequency lower than the first frequency, and a pulse signal with a third frequency lower than the second frequency.

8. The method for manufacturing a semiconductor device, according to claim 7, further comprising:

a second process of forming the second insulating film by alternately stacking a silicon oxide layer and a silicon nitride layer in layers.

9. The method for manufacturing a semiconductor device, according to claim 7, wherein the time for the second period is set to 50 microseconds or more.

10. The method for manufacturing a semiconductor device, according to claim 7, wherein the second conductive member is not exposed at a surface of the material to be processed.

11. The method for manufacturing a semiconductor device, according to claim 7, further comprising:

before the first process, a second process of, while applying bias power using an ion species, etching the second insulating film without exposing the second conductive member, wherein the a duty ratio of the bias power of the second process is set to 100%.

12. The method for manufacturing a semiconductor device, according to claim 11, wherein, in the second process, the bias power is continuously applied or is intermittently applied at a duty ratio higher than the ratio of the time for the first period to the time for the second period.

13. The method for manufacturing a semiconductor device, according to claim 11, further comprising:

after the second process and before the first process, a third process without applying bias power.

* * * * *